United States Patent
Teske

[15] 3,665,219
[45] May 23, 1972

[54] ELECTRICAL CONTROL SYSTEM

[72] Inventor: Daniel E. Teske, Tulsa, Okla.
[73] Assignee: Emerson Electric Co., St. Louis, Mo.

[22] Filed: June 19, 1970
[21] Appl. No.: 47,743

[52] U.S. Cl. ....................307/252 B, 307/252 N, 317/33 SC, 323/22 SC, 331/112
[51] Int. Cl. ....................H03k 17/00
[58] Field of Search ....................307/252.21, 252.73, 252.70, 307/305; 323/22 SC; 317/33 SC; 331/112

[56] References Cited

UNITED STATES PATENTS

| | | | |
|---|---|---|---|
| 3,297,954 | 1/1967 | Wiley | 331/112 |
| 3,142,781 | 7/1964 | Izenour | 307/252 T |
| 3,473,101 | 10/1969 | Muskovac | 307/252 T |
| 3,486,038 | 12/1969 | Skamfer | 307/252 T |
| 3,383,623 | 5/1968 | Vercellotti | 307/252 T |
| 3,524,078 | 8/1970 | Harris | 307/252 B |
| 3,513,332 | 5/1970 | Snyder | 307/252 B |

*Primary Examiner*—Rudolph V. Rolinec
*Assistant Examiner*—David M. Carter
*Attorney*—William R. O'Meara

[57] ABSTRACT

An A.C. semiconductor switch controlling the energization of a load from a relatively high voltage source is controlled by signal pulses supplied to the semiconductor from a circuit connected to a relatively low voltage source. The control signal circuit incorporates a D.C. to A.C. converter including a rectangular hysteresis loop type transformer having feedback windings, and a pair of transistors arranged to provide a multivibrator type oscillator that produces the signal pulses for the switch in response to the application of a voltage to the converter. The converter provides control and electrical isolation between the relatively low and high voltage circuits.

6 Claims, 1 Drawing Figure

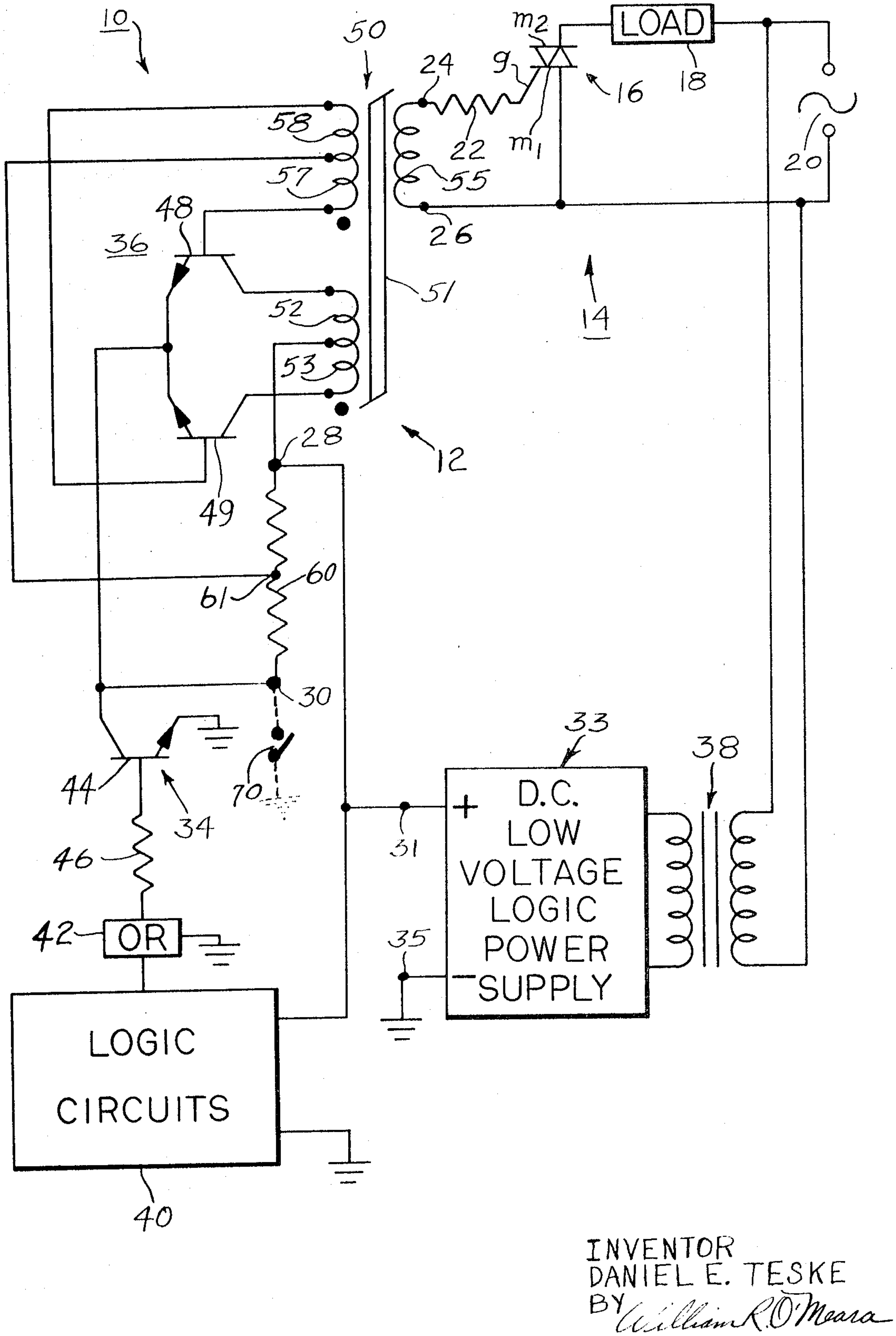
INVENTOR
DANIEL E. TESKE
BY William R. O'Meara

ELECTRICAL CONTROL SYSTEM

BACKGROUND OF THE INVENTION

This invention relates to electrical control systems and more particularly to a control system for controlling solid state switch means.

In controlling the operation or conductivity of a semiconductor switching device, for example, one connected to a relatively high voltage supply source, control signals are often developed in a circuit operating on a relatively low voltage, such as conventional logic circuits, and it is therefore, often desirable or necessary to provide electrical isolation between the relatively high and low voltage circuits. Such isolation is a safety feature in that it provides protection against the possibility of persons receiving electric shocks such as when working on low voltage circuits, for example, that normally could not produce an electric shock. Also, the electrical isolation prevents electrical noise or surge effects in the high voltage circuit from affecting the operation of the low voltage circuits. Electrical isolation is, of course, especially important where inductive loads, such as electric motors, or the like, are switched between on and off conditions.

In some isolating circuits of the prior art, mechanical relays and light responsive devices were used, however, such devices had, for example, the disadvantages of relatively large power requirements, time delays, etc.

SUMMARY OF THE INVENTION

Accordingly, it is a general object of the present invention to provide novel control means for a solid state switch.

A more specific object of the present invention is to provide a novel control system in which solid state switch means connected in a circuit operating on a relatively high voltage is controlled by signals from a circuit operating on a relatively low voltage wherein the control system provides good electrical isolation between the relatively high and low voltage circuits.

Another object is to provide novel control means for a semiconductor switch connected in a circuit with a load and a relatively high voltage supply source, which provide electrical isolation between the load circuit and other circuits operating from a relatively low voltage supply source, and which also minimizes the possibility of radio frequency noise in the load circuit as a result of switching.

Still another object is to provide a control circuit for an alternating current semiconductor switch connected to a relatively high voltage load circuit wherein relatively high frequency alternating current control signals are supplied to the switch from low voltage circuits, and wherein the load circuit is isolated from the low voltage circuits.

In accordance with one aspect of the present invention, a control system for supplying control signals to solid state switching means is provided with includes oscillator means including switch means and saturable transformer means having winding means including output winding means, and means coupling the output winding means to the switching means.

These and other objects and advantages of the present invention will become apparent from the following description and accompanying drawing.

BRIEF DESCRIPTION OF THE DRAWING

The single FIGURE of the drawing is a schematic diagram of an electrical control system in accordance with a preferred embodiment of the present invention.

DESCRIPTION OF THE PREFERRED EMBODIMENT

Referring now to the drawing, a switch control system 10 is shown including a signal producing circuit 12 coupled to control a main load or switching circuit 14 shown as including a main solid state or semiconductor switching device 16 connected in series with a load 18 across a relatively high voltage, alternating current, power supply source 20.

The main switching device 16 is shown as a solid state alternating current thyristor switch known as a triac. The triac 16 has its main terminals $m_1$ and $m_2$ in series with the load 18 to control the energization of the load. The conductivity of the triac 16 is controlled by controlling the application of signal pulses to the gate terminal *g*. A current limiting resistor 22 is shown connected in series with output terminals 24 and 26 of the signal producing circuit 12 between the gate *g* and main terminal $m_1$ of triac 16. As is well known, a triac, such as triac 16, requires a triggering or gating pulse on both half cycles of the supply voltage of source 20 to effect conduction on both half cycles.

The signal producing circuit 12 has a pair of low voltage power input circuit terminals 28 and 30. Terminal 28 is connected to a positive power supply terminal 31 of a low voltage, direct current, power supply source 33. The input circuit terminal 30 is connected through a condition responsive control device, shown as a switching circuit 34, to ground or to a negative terminal 35 of the low voltage source 33 which is shown grounded. The signal producing circuit 12 includes an oscillator circuit, indicated generally at 36, which is started or actuated in response to the application of a D.C. voltage at the input terminals 28 and 30 to produce alternating current signals or signal pulses at output terminals 24 and 26 on both half cycles of the supply voltage of source 20.

The D.C. source 33 is shown coupled to the A.C. source 20 through a transformer 38 which may be a step-down transformer. The A.C. supply source 20 may be, for example, a conventional 115 volt source and the D.C. source 33 may be a 15-volt source connected to supply, for example, power to a plurality logic circuits, indicated generally at 40, which, for example, include a condition responsive circuit connected to the input of any suitable or conventional OR circuit shown at 42 which, in turn, is connected to operate circuit 34 which is shown as a transistor circuit. The logic circuits may include, for example, computer circuits requiring the low voltage of D.C. source 33. Source 33 may be any well known D.C. voltage supply source and may include well known solid state voltage regulating means or the like to maintain the low voltage supplied to the logic circuits 40 substantially constant.

Transistor circuit 34 is illustrated as including a transistor 44 with its collector electrode connected to input terminal 30 and the emitter electrode connected to ground or the negative side 35 of the D.C. source 33. The base electrode of the transistor is connected through a current limiting resistor 46 to the output of the OR circuit 42. In the absence of a voltage output from the OR circuit, the transistor 44 is biased to the nonconductive state. The OR circuit 42 when producing an output provides a direct current voltage of predetermined value which provides current voltage base to emitter current to turn on or effect conduction of the transistor 44 to thereby apply the D.C. voltage of source 33 to input terminals 28 and 30 to cause the oscillator 36 to go into oscillation, as will be more fully discussed hereinafter. The oscillator 36 is shown including a pair of switching devices illustrated as a pair of transistors 48 and 49, and a transformer 50 arranged in a magnetic coupled multi-vibrator type of circuit. An oscillator similar to oscillator 36 is shown and described in an article entitled "Conventional Converter and Inverter Design," pages 19–22 of the Design Manual Featuring Type Wound Cores, TWC–300, Magnetics, Inc., Butler, Pennsylvania.

Transformer 50 is shown having a saturable magnetic core 51 on which are similarly wound like primary windings 52 and 53, a secondary winding 55 connected to terminals 24 and 26, and a pair of like feedback windings 57 and 58 shown similarly wound on core 51. The core 51 may be one having a rectangular hysteresis loop.

The adjacent ends of the primary windings 52 and 53 are connected together and to input terminal 28 and the positive supply terminal 31, and the opposite ends of these windings are respectively connected to the collector electrodes of transistors 48 and 49. The emitter electrodes of these transistors are connected together to input terminal 30 and to the collector electrode of switching transistor 44. The emitter electrode of transistor 44 is connected to ground or grounded supply terminal 35. A voltage divided resistor 60 is shown connected between input terminals 28 and 30 and having an intermediate tap or terminal 61 connected to the adjacent ends of the feedback windings 57 and 58. The other ends of feedback windings 57 and 58 are respectively connected to the base electrodes of transistors 48 and 49.

The primary windings 52 and 53 respectively carry the load or output currents of transistors 48 and 49. The output currents flow in the windings 52 and 53 in opposite directions to induce voltages in the feedback windings 57 and 58 of opposite polarity, i.e. an increasing current, for example, in winding 52 will effect an induced voltage of one polarity in the feedback windings, while an increasing current in winding 53 effects an induced voltage of opposite polarity in the feedback windings.

The feedback windings 57 and 58 are connected in the bias circuits of the transistors 48 and 49 and the voltages induced in these windings control the conductivity of these transistors by alternately turning them on and off during operation. When terminal 30 is grounded through oscillator control transistor 44, the bias current circuit for transistor 48 includes terminal 61, feedback winding 57 the base and collector of transistor 48 and ground. The bias current circuit for transistor 49 includes terminal 61, feedback winding 58, the base and emitter of transistor 48, and ground. With this arrangement, an induced voltage of one polarity across windings 57 and 58 aids or provides the bias current of switching transistor 48 to turn it on, and opposes bias current for the other switching transistor 49, while an induced voltage of opposite polarity opposes bias current of transistor 48 and aids or provides the bias current for transistor 49 to turn it on.

In describing the operation of the control system 10, it will first be assumed that the main switch 16 is non-conductive or "off" and the OR circuit 42 has zero output. Under these conditions, there is no bias current flowing between the base and emitter of transistor 44 so that transistor 44 is "off" or non-conductive. With transistor non-conductive, there is no input voltage across input terminals 28 and 30 and the oscillator has no output voltage signals at terminals 24 and 26. Under these conditions the triac 16 is non-conductive and the load 18 is not energized.

Upon the occurrence of a predetermined condition in one of the logic circuits 40, a signal is applied to the OR circuit 42 to produce an output that, in turn, supplies bias current, base-to-emitter current, to turn-on or effect conduction of transistor 44. The input terminal 30 is then connected to ground through the collector-emitter circuit of transistor 44 so that the D.C. voltage of supply source 33 is connected across the voltage divider 60 between input terminals 28 and 30.

Two transistors, such as transistor 48 and 49, generally do not have identical characteristics, for example, one may have a greater initial leakage than the other. It will be assumed herein for the purpose of explanation, that when voltage is first applied across terminals 28 and 30 the transistor 48 has a greater leakage current than transistor 49. These output currents flow from terminal 28, through windings 52 and 53, the collector-emitter circuits of transistors 48 and 49, and through transistor 44 to ground.

The polarities of the resultant induced voltages in the feedbacks windings 57 and 58 due to current flow in windings 52 and 53, in this case, will be such that the voltage induced in winding 57 will aid or effect forward bias current of transistor 48 while the polarity of the induced voltage in winding 58 opposes forward bias current or effects a reverse biasing of transistor 49. This provides a positive feedback for transistor 48 causing the output to further increase while turning-off transistor 49. When the output of transistor 48 reaches a predetermined value, the core 51 saturates and the induced voltage supplying bias current for transistor 48 is reduced or removed producing a rapid turn-off of transistor 48. The turn-off of the output current of transistor 48 produces an inductive kickback pulse that induces a voltage in windings 57 and 58 having reverse polarity to provide bias current to and turn-on transistor 49, and a reverse biasing effect for transistor 48. The output current of transistor 49 provides an induced voltage in winding 58 which provides positive bias current to transistor 49, and increases to saturate core 51 and this removes the induced voltage supplying the bias current for transistor 49. Transistor 49 then turns-off producing an inductive kickback pulse which produces a voltage in feedback winding 57, that turns-on transistor 48. Thus, the inductive kickback pulse produced by one transistor turning-off is the means by which the other transistor is turned-on. The turning-on and turning-off of the switching transistors 48 and 49 is, of course, rapid and produces oscillations or alternating pulses in the transformer windings.

The alternating pulses induced in secondary windings 54 are applied to the gate *g* of the triac 16 to provide a triggering pulse on each half cycle of the supply voltage of source 20. The triac 16 thus becomes conductive on each half cycle to effect alternating current flow through load 18.

Whenever the OR circuit 42 is turned-off, for example, by a condition responsive signal from logic circuits 40, the control transistor 44 becomes non-conductive or is turned-off to remove the ground connection from terminal 30 which stops the operation of the oscillator circuit 36. Triggering pulses at secondary winding 24 cease and the triac becomes non-conductive.

Instead of utilizing the circuits 34 and 42 to control the oscillator circuit, a simple switch 70 shown in a dashed line and connected between terminal 30 and ground, could be used. Closing the switch 70 applies the supply voltage of source 33 to input terminals 28 and 30 to effect oscillations of circuit 36 and conduction of triac 16. When the switch 70 is opened, either manually or automatically, the supply voltage is, of course, removed from input terminals 28 and 30 and the oscillations stop, thus effecting the turning-off of the triac 16.

The low voltage circuits connected to the D.C. power supply 33 are not affected by the switching on and switching off of the relatively high voltage load circuit 14 because of the isolation provided by transformer 50. Even where relatively heavy loads and inductive loads, such as an electric motor are turned on and off, noise and current surge effects are substantially isolated from the low voltage circuits. Also, the low voltage circuits are so isolated from the high voltage circuits to protect against electrical shock based on the high voltage of the power supply 20. The oscillator 36 may operate at a much higher frequency (for example, 1,500 HZ) than the power line frequency of source 20 (for example, 60 HZ) thereby supplying the triac 16 with both polarities of gate trigger voltages early in each half cycle. This arrangement has the advantage of reducing any R.F. noises in the power circuit after the initial turn-on since the triac is triggered into conduction early in each half cycle.

Magnetic coupled or saturable core transformer type of inverters of the type described herein are well known to those skilled in the art. Some converters and inverters of this type are also discussed, for example, in the Transistor Manual of Radio Corporation of America, August 1967, Technical Series SC–13, Electronics Components and Devices, Harrison, New Jersey.

From the foregoing, it is now apparent that novel electrical control system meeting the hereinbefore mentioned objects is provided. It is understood that changes and modifications to the form of the invention set forth herein by way of illustration made be made by those skilled in the art without departing from the scope of the invention as defined in the claims which follow.

What is claimed is:

1. A control system for controlling the conductivity of solid state alternating current switch means connected in an alternating current circuit having a load and a source of supply voltage, said switching means having control means responsive to voltage pulses to control the conductivity of a said switching means, said control system comprising an oscillator circuit including an input circuit, means including switch means and low voltage supply means for supplying an input voltage having a magnitude substantially lower than that of said supply voltage to said input circuit, a pair of transistors each having base, collector and emitter electrodes, a saturable core transformer including a saturable core, a pair of main windings, a pair of feedback windings, and an output winding, all of said windings being disposed on said core, one of said main windings being coupled in series with the emitter and collector of one of said transistors and to said input circuit, the other of said main windings being coupled in series with the emitter and collector of the other of said transistors and to said input circuit, said feedback windings being coupled respectively to the base electrodes of said transistors for supplying bias current for said transistors in response to induced voltages in said feedback windings, whereby output of said transistors is utilized to turn off successively and alternately one or the other of said transistors, and means coupling said output winding to said control means, said main windings and said feedback windings being related to effect alternate conduction of said transistors to produce a signal pulse in said output winding on both half cycles of said supply voltage to thereby effect conduction of said switching means on both half cycles of said supply voltage when said input voltage is supplied to said input circuit.

2. The control system according to claim 1 wherein said switching means is a triac, and said core has a generally rectangular hysteresis loop.

3. The control system according to claim 2 wherein said switch means is a transistor.

4. The control system according to claim 2 further including other circuit means supplied by said low voltage supply means and including means responsive to a predetermined condition to effect operation of said switch means, said low voltage supply means comprises a source of direct current.

5. The control system according to claim 2 wherein said switch means comprises a solid state switch device, and said other circuit means includes an OR circuit connected to control said switch device in response to said predetermined condition.

6. The control system according to claim 5 wherein said switch device is a transistor and said low voltage supply means comprises a direct current source.

* * * * *